May 23, 1967 B. T. MURPHY 3,321,340

METHODS FOR FORMING MONOLITHIC SEMICONDUCTOR DEVICES

Original Filed Oct. 20, 1961 2 Sheets-Sheet 1

May 23, 1967 B. T. MURPHY 3,321,340

METHODS FOR FORMING MONOLITHIC SEMICONDUCTOR DEVICES

Original Filed Oct. 20, 1961

2 Sheets-Sheet 2

INVENTOR
Bernard T. Murphy
BY
Gordon H Telfer
ATTORNEY

United States Patent Office 3,321,340
Patented May 23, 1967

3,321,340

METHODS FOR FORMING MONOLITHIC SEMICONDUCTOR DEVICES

Bernard T. Murphy, Greensburg, Pa., assignor to Westinghouse Electric Corporation, Pittsburgh, Pa., a corporation of Pennsylvania Original application Oct. 20, 1961, Ser. No. 146,624, now Patent No. 3,237,062, dated Feb. 22, 1966. Divided and this application Nov. 17, 1965, Ser. No. 508,225
9 Claims. (Cl. 148—175)

This application is a division of application Ser. No. 146,624, filed Oct. 20, 1961, now Patent No. 3,237,062, issued Feb. 22, 1966.

This invention relates generally to monolithic semiconductor devices which provide within a unitary body of semiconductive material the electronic function of an entire circuit of conventionally interconnected components. More particularly, the invention is directed to an improved structure for monolithic semiconductor devices in general and to methods of producing monolithic semiconductor devices.

A monolithic semiconductor device, often referred to as a functional electronic block, incorporates within a unitary body of material all the individual functions of the elements comprising an entire circuit such as an amplifier, an oscillator, a multivibrator or a logic gate. In the design of functional electronic blocks the problem is often encountered of providing effective electrical isolation between two or more portions of the block except in certain desired current paths. One known method of solving this problem which has been at least partially successful is that of utilizing a main body of high resistivity starting material to decrease the electrical interaction between different functional portions. More highly doped regions formed on opposite surfaces of the body of the high resistivity material provide the functional regions. Difficulties arise because the degree of isolation is not as high as is desired and therefore it is necessary to use a large volume of the high resistivity material thus increasing the size of the device.

It is also the case that it is desirable to decrease the saturation resistance in those portions of the block providing transistor functions so that a sharper transistor characteristic is obtainable. Unfortunately, the prior isolation method increases the saturation resistance since a portion of the high resistivity material is within the transistor structure. The improvements of providing more complete isolation between different portions of the block and decreasing the saturation resistance in the transistor portions would make the fabrication of some types of functional electronic blocks simpler and would make possible other types which were not previously possible.

It is therefore an object of the present invention to provide improved structures for functional electronic blocks.

Another object is to provide improved methods for fabricating functional electronic blocks.

Another object is to provide structures, and a method of forming the structures, for functional electronic blocks which provide an inherent high degree of electrical isolation between portions of the block.

Another object is to provide functional electronic blocks and methods of making them which provide a low saturation resistance in the transistor portion.

In accordance with this invention, improved functional electronic blocks are provided having a basic structure comprising a very high resistivity material (at least about 100 ohm-cm.) of a first type of semiconductivity having regions of low resistivity material of a second type of semiconductivity on one surface thereof; a layer of high resistivity material of said second type of semiconductivity is disposed completely over said one surface and other highly doped regions are disposed thereon. In accordance with the improved method of the present invention, the second high resistivity layer is grown epitaxially over the surface of the very high resistivity block having the low resistivity portions thereon. The epitaxial layer is characterized by having a relatively uniform doping impurity distribution. A preferred thickness for the epitaxial layer is in the range from about 10 microns to about 20 microns. The resistivity of the epitaxial layer is preferably in the range of about 1 to about 100 ohm-cm.

The present invention, both as to its organization and fabrication, together with the above-mentioned and further objects and advantages thereof, may best be understood by reference to the following description, taken in connection with the accompanying drawings, in which.

Figure 1:
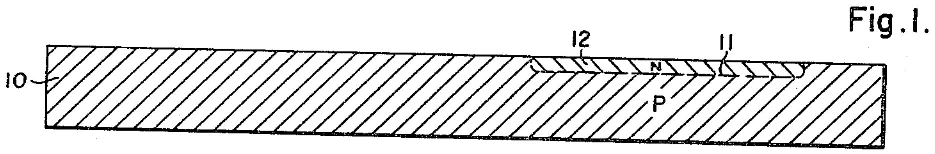
FIGURES 1 through 6 are cross sectional views of a generalized functional electronic block at various progressive stages of fabrication in accordance with the present invention.

The starting point in the practice of this invention is a wafer of high resistivity semiconductor material, at least 100 ohm-cm., of a convenient thickness for mechanical strength of about 4 mils. It is generally advantageous to use a wafer with p-type semiconductivity, but a wafer having n-type semiconductivity can also be used. The starting p-type wafer 10 is shown in FIG. 1 with an n-type layer 12, having a sheet resistivity of about 1 to about 10 ohms per square and about 8 to 10 microns deep, diffused into a select area of the surface of the wafer 10 as is dictated by block design. The diffusion to provide layer 12 may be done using a suitable n-type impurity such as phosphorous or arsenic as the diffusant and well known oxide masking techniques. The doping level at the surface of layer 12 is in the range from about $10^{19}$ to about $10^{21}$ atoms per cubic cm. The purpose of the n-type layer 12 is to provide a low resistivity collector region in a transistor structure. A p-n junction 11 is between the bulk material 10 and the n-type region 12. The region 12 has a resistivity at least about an order of magnitude less than that of either of the layers 10 or 14.

Figure 2:
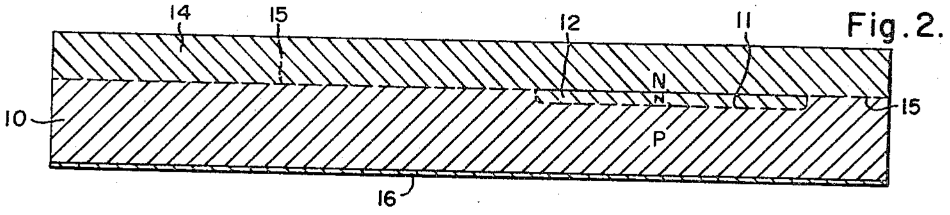

The next step resulting in the structure shown in FIG. 2 is that of growing a high resistivity n-type layer 14 on the surface of the block using epitaxial growth techniques. Epitaxial growth in semiconductor technology means growth on a single crystal of material deposited from the vapor phase, the growth being such as to continue the original single crystal structure. It is well known in semiconductor technology and provides a means of forming a very thin layer having a high purity on a relatively impure substrate. The particular method of epitaxial growth used in the practice of this invention is not critical. Several methods are now known and others are being developed. As an example, one such method for epitaxial growth of silicon layers on a silicon wafer involves a chemical disproportionating reaction involving passing of silicon iodide vapors over the heated wafer 10. A similar reaction permits epitaxial growth of germanium on germanium crystals by passing germanium iodide vapors thereover. Another method includes growth of an epitaxial layer of silicon on silicon from an atmosphere comprising a mixture of hydrogen and silicon tetrachloride carried out at a relatively high temperature. Reference is made to Longini application Ser. No. 145,646, filed Oct. 17, 1961, and now abandoned, and assigned to the same assignee as the present invention, for details on such a process.

The thickness of the epitaxial layer 14 is desirably quite small. The epitaxial layer may contain a doping impurity and is preferably n-type. Present information indicates that the optimum thickness of this layer is in the range from about 10 microns to 20 microns. However, layers from a few microns to several hundred microns may be desired in some cases. The epitaxial layer may be grown only on the upper surface of the wafer 10 if desired by providing an oxide layer 16 on the sides and underside. Wherever the epitaxially grown layer 14 contacts the bulk material of wafer 10 a p-n junction 15 is formed.

The resistivity of the epitaxial layer 14 is selected to be sufficiently high to provide lateral electrical isolation while not contributing too much to transistor saturation resistance. Hence, a design compromise is made with a resistivity in the range from about 1 ohm-cm. to about 100 ohm-cm. being generally suitable.

Figure 3:
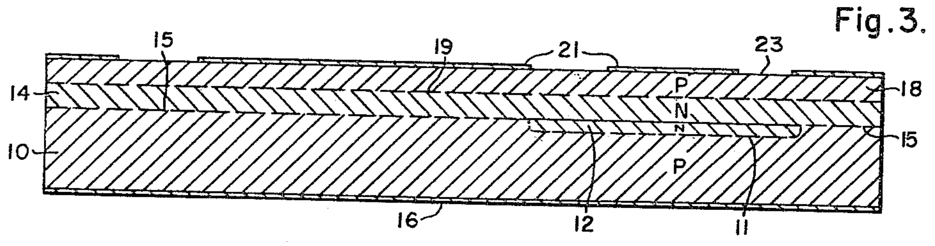

Next, as shown in FIG. 3, a p-type diffused layer 18 is formed in the epitaxially grown layer 14 to a thickness of about 3 to 4 microns. Diffusion may be carried out by using a suitable p-type impurity such as boron and known diffusion techniques. A p-n junction 19 is formed within the epitaxial layer 14 at the interface of the diffused layer 18.

Figure 4:
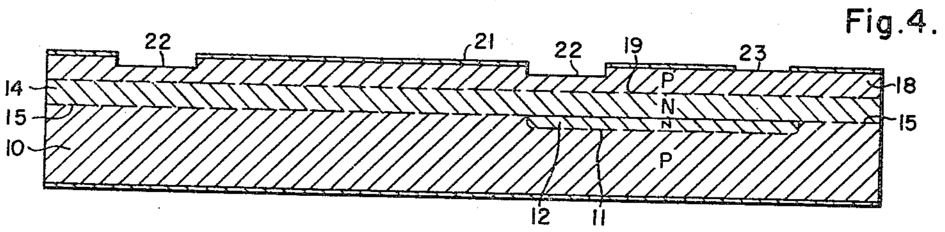

Thereafter, an oxide mask 21 is formed on the body with openings therein for transistor emitter and additional areas as will be explained subsequently. The oxide is removed from these areas to form the desired openings by an oxide etching process. The opening 23 defining the emitter area is then covered with a masking material such as a wax (not shown) and the block is exposed to a silicon etch to remove about half or a little more of the thickness of layer 18 from the surface. This results in the structure appearing in FIG. 4 with the etched depressions 22. Alternatively, photoresist or other masking could be used instead of wax masking.

Figure 5:
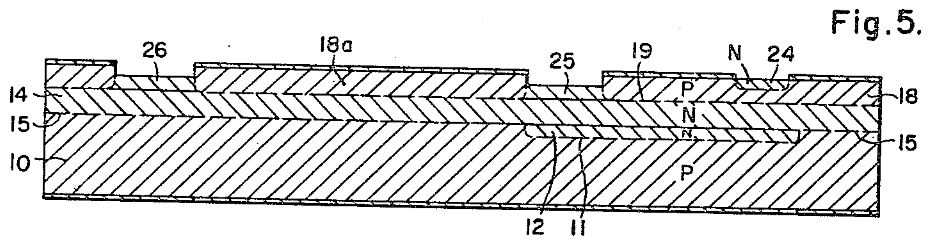

The block is then cleaned of wax but not oxide and the diffusion of n-type doping material is carried out at depressions 22 and area 23 at the same time, the diffusion producing collector and resistor contact areas 25 and 26, respectively, so that low resistivity n-type material extends through the p-type layer 18 at depressions 22 and into the n-type epitaxial layer 14. The n-type doping extends only partway into the layer 18 at opening 23. The structure of FIG. 5 is the result with emitter 24 forming a p-n junction with layer 18.

Figure 6:
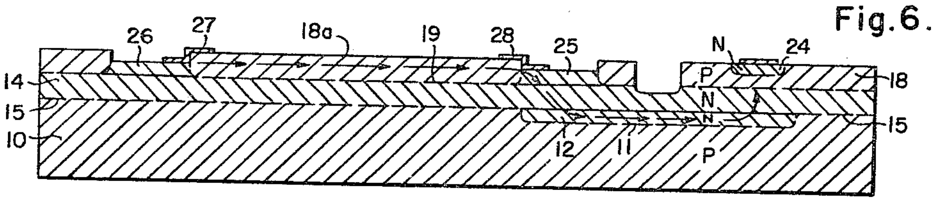

In the generalized process for forming a functional electronic block shown in FIGS. 1 through 5, there results a transistor portion having regions forming the emitter 24, base 18 and collector 12 with a resistive region **18*a* of another portion of the layer 18 providing a bias resistance connected to the collector 12. Therefore, a point for bias potential application exists at the extremity of the resistive region 18*a* and it is necessary that isolation be provided between the bias point and the collector region 12 except through the resistive region 18*a*. In FIG. 6 is shown the completed structure with a bias contact 27 and a collector contact 28 at opposite extremities of the resistance 18*a***.

In the situation as shown in the FIGS. 1 to 6 where a resistance in the p-type diffused layer runs from a positive supply contact to a transistor collector or base, a current inevitably flows into the underlying n-type material in the vicinity of the positive supply contact. If a contact at that point is formed simply by making contact to the p-type skin, the current flowing from the contact through the p-type skin into the n-type layer will consist of holes injected into the n-type layer due to the forward bias across the junction. If this were done in the design shown here the holes would flow across the reverse biased p-n junction between the epitaxial material and the bulk material as in transistor action. In that case the purpose of starting with p-type material would be defeated since it would be just as effective to use an n-type bulk material on which the collector contacts are formed.

However, by shorting the junction 19 below the positive supply contact 27, as shown in FIG. 6, the injection of holes into the n-type epitaxial layer 14 can be avoided. In this way, of course, the reverse bias across junction 15 is effective to provide electrical isolation.

It will also be necessary to insure a similar variation of potential with distance along the resistor in the diffused and epitaxial layers. The relative variation of potential can readily be achieved in the final step of block fabrication which consists of etching resistor channels and transistor mesas. This step is carried out using the photoresist techniques as in present fabrication procedures. However, in this last case it is necessary that the etch should penetrate through the whole epitaxial layer 14 rather than the diffused p-type layer 18 only. In this way the undesired paths of the n-type epitaxial layer 14 are minimized and since they will everywhere have the same width as the overlying p-type resistors, the requirements of relative potential variation outlined above will be satisfied.

In the transistor portion of the new configuration it can be seen that the saturation resistance will be due to the contact resistance, the resistance of the n-type diffused layer 12 and the resistance of the epitaxially grown layer 14 below the emitter 24. The first two effects are very small. The resistance of the epitaxially grown layer 14 is much smaller than the corresponding layer of previously constructed functional electronic blocks since the epitaxially grown layer 14 is much thinner than the corresponding layer in previous designs. Despite the relatively high resistivity of the layer 14, the volume in the transistor is so small that the contribution to resistance is small. In effect, there need be virtually no high resistivity layer in the transistor structure. The bulk material 10 provides a support on which the transistor structure rests. Conductivity modulation effects result from (1) the normal injection of carriers due to transistor action, (2) the fact that in saturation, the collector junction is forward biased which results in the injection of holes into the collector regions. Conductivity modulation and the high conductivity diffused layers immediately below the collector contact 28 help avoid any high resistivity effects.

The junction 15 between the n-type expitaxial layer 14 and the bulk material in wafer 10 provides effective isolation between component parts of the block. The bulk material in wafer 10 will assume the lowest potential of any of the n-type regions above it such as the layer 12. This is necessarily so because otherwise either junction 11 or 15 would be forward biased over some area resulting in a discharge through that area. This means that the junction 15 between the high resistivity p-type wafer 10 and the epitaxial layer 14 is in reverse bias in all other areas and the only D.C. coupling through the p-type wafer 10 is due to leakage. A.C. coupling is reduced because of the low capacitance of the p-n junction 15 between the two high resistivity regions of 10 and 14. It can now be further reduced since there is no limitation on the resistivity of the starting material due to transistor requirements and the purest material obtainable can be used.

The principal source of undesirable interconnections in previous functional blocks is through the starting material. Interconnections of this type may exist in the proposed structures in the epitaxially grown layer 14, but since this layer 14 is reduced in thickness by an order of magnitude below the thickness required in present blocks, the interconnection is slight. Further reduction in current through the n-type layer 14 may be made by etching away that portion of the layer 14 except under the resistors such as 18*a*. Additional advantages of the present method over previous ones is that there is no need for a cavity in the starting wafer 10 in the collector region of the transistors since the transistor structure is built up on just one side of the starting wafer. Another advantage is that all ohmic contacts to the device may be made to the upper surface.

Figure 7:
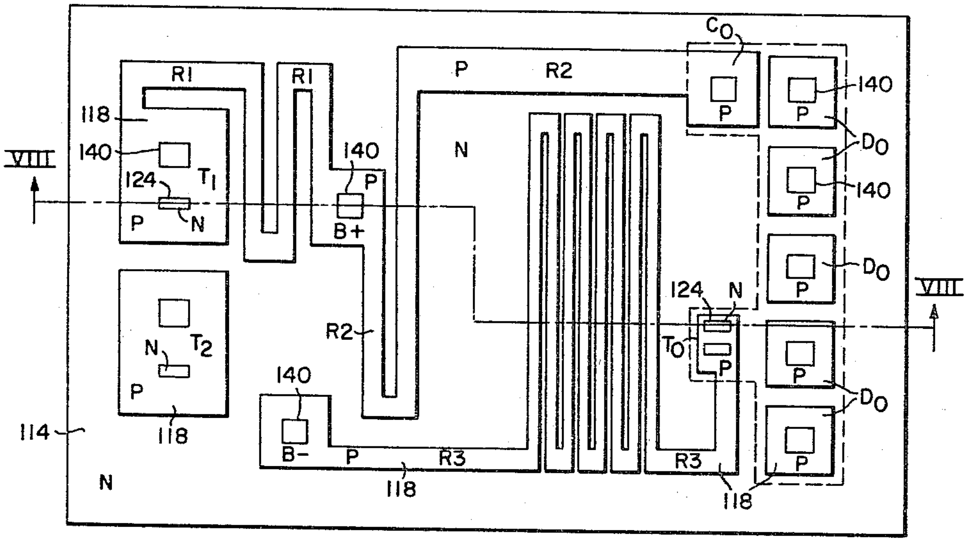
FIG. 7 is a plan view of a functional electronic block providing the function of a stroke logic element made in accordance with the present invention and shown as a specific application of its teachings.
Figure 8:
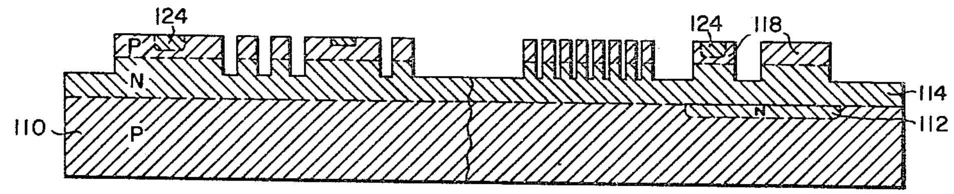
FIG. 8 is a cross sectional view of the block of FIG. 7 taken along the line VIII—VIII; and, FIG. 9 is the approximate equivalent circuit of the device of FIGS. 7 and 8.
Figure 9:
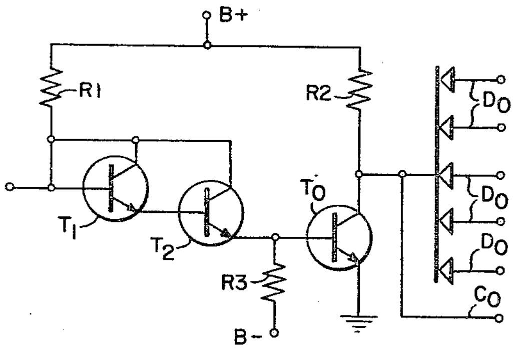

There will now be described a specific example of a device designed and fabricated in accordance with the present invention. The view of FIGS. 7 and 8 shows a monolithic semiconductor device providing the function of a stroke logic element having the approximate equivalent circuit as shown in FIG. 9. Copending application Ser. No. 140,472, filed Sept. 25, 1961, now Patent 3,209,214, issued Sept. 28, 1965 discloses a monolithic stroke element of similar geometry without the use of an epitaxial layer. While the stroke logic element is given as a specific example of the practice of the present invention, it is to be specifically understood that the application of the principles of this invention may be made to a wide variety of functional electronic blocks including amplifiers, oscillators, multivibrators and others. In any case in which there is the necessity for isolation between two or more portions of the block, the practice of the present invention is advantageous. FIGS. 7 and 8 show the structure of the stroke gate including a layer applied by epitaxial growth. The structure comprises generally a base 110 of high resistivity p-type bulk material, select portions of n-type diffused material 112 in the bulk material base, an epitaxially grown n-type layer 114, a p-type diffused layer 118 and an n-type diffused layer 124. The conductivity types given are merely by way of example.

Input diodes are formed of what are essentially three-layer transistor structures $T_1$ and $T_2$ (FIGS. 7 and 9) which have certain junctions shorted out in accordance with the teachings of referred to Patent 3,209,214. Specifically, each transistor comprises a portion of the n-type epitaxial layer 114 as its collector, a portion of the p-type diffused layer 118 as its base and a region of n-type material diffused therein as the emitter. Each of the collector regions of transistors $T_1$ and $T_2$ is shorted out to the base of transistor $T_1$. A diffused collector region may be used but is not essential in transistors $T_1$ and $T_2$.

The transistor region $T_0$ is formed substantially as shown in FIGS. 1 through 6. Here, however, the collector low resistivity region 112 is enlarged to provide also an opposing surface in the output diode region $D_0$ which comprises the p-type surface layer 118 and the n-type epitaxial layer 114 and a contact from the collector of the transistor $T_0$.

The resistors R1, R2 and R3 are formed in portions of the p-type layer 118. Ohmic contacts 140 are provided where necessary on the device 118. As shown, the p-type layer has been etched away except in those regions essential to the structure. Alternatively, the p-type layer may be diffused into the epitaxial layer in a pattern only in the desired portions. To provide the circuit equivalent of FIG. 9, it is of course necessary to provide a conductive path (as by a wire or an evaporated metal layer) between the emitter 124 of $T_2$ and the base 118 of $T_0$, and also between the emitter of $T_1$ and the base contact of $T_2$. The collector contact $C_0$ and the B+ and B− contacts may be made similarly to those in FIG. 6.

The essential operations for the fabrication of the block shown in FIGS. 7 and 8 will now be given. While the following description is given for the making of a mesa type structure wherein a continuous p-type diffused layer is formed which is etched away except where desired, the necessary modifications to make a planar structure wherein the p-type diffused layer is formed only where desired, thus giving a planar surface, are apparent. While silicon is given as an example of the semiconductive material, this choice is not critical, it is to be understood that other semiconductor materials may also be used, such as germanium or a compound comprised of stoichiometric portions of elements of Group III and Group V of the Periodic Table, fo rexample, gallium, arsenide, gallium antimonide, gallium phosphide, indium arsenide and indium antimonide. It will also be understood that the device may be fabricated so that the semiconductivity of the various regions is the reverse of that shown and described previously.

There is first obtained a wafer 110 of silicon containing a suitable p-type impurity prepared by methods known to those skilled in the art. For a starting material of very high resistivity of about 5,000 ohm-centimeters, the impurity level is adjusted to the appropriate level by vapor diffusion doping. The wafer may b sliced from a crystal and polished and etched on one side to produce a smooth surface. An oxide layer is formed on the surface to a thickness of approximately one micron. This may be formed by thermal oxidation of the wafer in water vapor with a silicon temperature of about 1150° C., a water bath temperature of 90° C. and argon as a carrier gas flowing at 1 liter per minute. The oxide layer is selectively etched away using known wax or photoresist masking techniques and hydrogen fluoride etchant, to remove oxide from those areas where it is desired to form a low resistivity n-type layer 112 as for the transistor collectors. Phosphorus is then diffused into the exposed areas at about 1075° C. for ½ hour, with $P_2O_5$ as the source at about 310° C. and dry oxygen as carrier gas flowing at 1 liter per minute.

In order to avoid the effects of phosphorus being out diffused from the regions 112 in the formation of the epitaxial layer 114, it is usually desirable to diffuse a uniform p-type layer (not shown) over the whole surface of the wafer 110, using gallium for example, prior to the phosphorus diffusion.

The remaining oxide layer is etched away with hydrofluoric acid and an epitaxially grown layer 114 is produced of n-type silicon having a resistivity of about 3 to 30 ohm-centimeters and a thickness of approximately 0.5 mil. To accomplish this, the silicon is placed in the reaction zone of a growth furnace and subjected to a surface cleaning treatment by pure hydrogen gas at about 1230° C. for 30 minutes. The atmosphere is then changed to a mixture of hydrogen and silicon tetrachloride, the latter at a partial pressure of 13 millimeters of mercury, and growth is allowed to proceed for about 40 minutes at about 1230° C. Under these conditions the growth rate has been found to be about 0.3 micron per minute. After the formation of the epitaxial layer 114 of a thickness of 12 microns, the wafer is again oxidized, and gallium is diffused for about 75 minutes at 1125° C. from gallium sesquioxide at 900° C. with hydrogen as the reducing atmosphere.

Then the oxide layer is selectively etched on the polished side to expose the silicon at the areas for the transistor emitter and junction bridging areas. Then the exposed emitter areas are covered with wax resist coating and the bridging areas alone etched with a mixture of nitric and hydrofluoric acids to a depth of 0.2 mil after removal of the wax resist. Phosphorus is then diffused into the emitter and bridging areas for 20 minutes at 1075° C. from a phosphorus pentoxide source at 310° C. using dry oxygen as the carrier gas. Thereafter the oxide is removed from the surface and by use of a photoresist mask all areas of the surface are covered except those to which ohmic contacts are to be made. Then a film of aluminum approximately 0.5 micron thick is evaporated over the entire surface. The photoresist and the undesired aluminum thereon is removed using trichloroethylene solvent. A photoresist etch mask to enable a mesa to be formed is applied and etching carried out to a depth of 0.3 to 0.4 mil. Then the collector areas of the mesa areas are coated with a wax mask and further etching continued to a depth of 0.2 to 0.3 mil. This etching forms transistor, diode and resistor mesas and also isolation slots where needed.

The above fabrication process has been successfully used for the formation of devices. Modifications of times, temperatures and other parameters can be made if necessary or as desired.

It will be noted that after the formation of the epitaxially grown layer 114 the fabrication may proceed as with previous functional electronic blocks.

Tests have been made on the response of conventional stroke gates and stroke gates formed in accordance with this invention. It has been found that the response to input pulses in identical test circuits shows that the epitaxially grown unit responds in a time about 1/5 that for a conventional unit. Further improvement in device performance also results from the reduction of the saturation resistance in the transistors areas.

While the present invention has been shown and described in certain forms only, it will be obvious to those skilled in the art that it is not so limited but is susceptible to various changes and modifications without departing from the spirit and scope thereof.

What is claimed is:

1. A method of making a monolithic semiconductor device including the steps of: diffusing, into at least one select portion of a first major surface of a body of semiconductive material of a first type of semiconductivity, a first pattern of at least one region of a second type of semiconductivity, while limiting the extent of said surface that is exposed to dopant during the diffusing of said first pattern so said at least one region is of small area compared with said surface; growing epitaxially a layer of second type semiconductivity material over said first major surface and said first pattern of regions; diffusing a second pattern of a plurality of spaced regions of said first type semiconductivity into a surface of said epitaxially grown layer remote from said first pattern, said second pattern including a region opposite said at least one region of said first pattern of regions; diffusing a third pattern of regions of said second type semiconductivity in select regions of said second pattern of regions, including said region opposite said at least one region of said first pattern, to form a plurality of electronic functional elements.

2. A method of making a monolithic semiconductor device capable of performing the function of a circuit of separate components which include at least one transistor and one resistance, said method including the steps of: obtaining a substrate of semiconductive material of a first type of semiconductivity having a resistivity of at least about 100 ohm-centimeters, said substrate having opposing major surfaces; forming by vapor diffusion a first region of a second type of semiconductivity in a first of said major surfaces having a sheet resistivity of from about 1 ohm per square to about 10 ohms per square to provide the function of a transistor collector region; forming by epitaxial growth a layer of said first type of semiconductivity over said first major surface, including said first region, having a resistivity of from about 1 ohm-centimeter to about 100 ohm-centimeter to form a p-n junction with said substrate to provide substantial electrical isolation in said device by reason of said p-n junction limiting conduction normal to said major surface and the relatively high resistivity of said layer and said substrate limiting conduction parallel to said major surface, said layer having a thickness of from about 10 microns to about 20 microns so as to make little contribution to transistor saturation resistance; forming by vapor diffusion at least two second regions of said first type of semiconductivity in the surface of said layer remote from said substrate, one such region being opposite said first region to provide the function of a transistor base region and the other region to provide the function of a resistance; forming by vapor diffusion a third region of said second type of semiconductivity in the exposed surface of said second region providing a transistor base region to provide the function of a transistor emitter region.

3. A method of making a monolithic semiconductor device in accordance with claim 3 including the additional step of: shorting the junction between said layer and said second region providing a resistance at a point remote from said regions providing transistor functions so as to avoid injection of minority carriers into said layer upon application of a potential at said point.

4. The subject matter of claim 1 further comprising: introducing, during the epitaxial growing of said layer, a quantity of doping impurity to provide a doping impurity concentration therein appreciably lower than that of said at least one region of said first pattern; applying ohmic contacts to regions of said second and third patterns; and retaining said plurality of electronic functional elements united by said body of semiconductive material.

5. The subject matter of claim 4 wherein: during said diffusing of said third pattern, at least one additional region of said second type of semiconductivity is diffused in a portion of said surface of said layer near said at least one region of said first pattern, said at least one additional region having appreciably greater impurity concentration than said layer and an ohmic contact is also applied to said at least one additional region; all of said diffusing operations are limited in extent to leave remaining material of said layer as grown without significant additional diffused impurities immediately adjacent said regions of said second pattern.

6. The subject matter of claim 5 wherein: the diffusing of said third pattern of regions is performed in less than all of said regions of said second pattern.

7. The subject matter of claim 1 further comprising: removing portions of said layer, while retaining physical unity in the structure, the removed portions being spaced from those portions in which said second pattern of regions is diffused.

8. The subject matter of claim 1 wherein: the impurity used in the diffusing of said first pattern of regions is a member of the group consisting of phosphorus and arsenic.

9. The subject matter of claim 8 wherein: the impurity is phosphorus and prior to diffusing it, said surface of said body is diffused with gallium.

References Cited by the Examiner

UNITED STATES PATENTS

| | | | |
|---|---|---|---|
| 3,149,395 | 9/1964 | Bray et al. | 148—175 |
| 3,152,928 | 10/1964 | Hubner | 148—33.5 |
| 3,165,811 | 1/1965 | Kleimack et al. | 148—175 |
| 3,211,972 | 10/1965 | Kilby et al. | 317—235 |

HYLAND BIZOT, *Primary Examiner.*

DAVID L. RECK, *Examiner.*

N. F. MARKVA, *Assistant Examiner.*